(12) United States Patent
Morita

(10) Patent No.: US 6,498,547 B2
(45) Date of Patent: Dec. 24, 2002

(54) ANISOTROPICALLY ELECTROCONDUCTIVE ADHESIVE AND A LADDER FILTER USING THE SAME

(75) Inventor: Koji Morita, Omihachiman (JP)

(73) Assignee: Murata Manufacturing Co., Ltd.

( * ) Notice: Subject to any disclaimer, the term of this patent is extended or adjusted under 35 U.S.C. 154(b) by 19 days.

(21) Appl. No.: 09/761,060

(22) Filed: Jan. 16, 2001

(65) Prior Publication Data

US 2001/0009393 A1 Jul. 26, 2001

(30) Foreign Application Priority Data

Jan. 18, 2000 (JP) ........................................ 2000-008944

(51) Int. Cl.⁷ .............................. H03H 9/58; H03H 9/60; C09J 119/00
(52) U.S. Cl. ...................... 333/189; 333/192; 156/327; 156/338
(58) Field of Search ................................ 333/186–196; 156/325–327, 329, 330, 338

(56) References Cited

U.S. PATENT DOCUMENTS

| | | | | |
|---|---|---|---|---|
| 5,359,760 A | * | 11/1994 | Busse et al. ............... | 29/25.35 |
| 5,484,648 A | * | 1/1996 | Odashima et al. .......... | 428/209 |
| 5,637,176 A | * | 6/1997 | Gilleo et al. ................. | 156/277 |
| 5,804,882 A | * | 9/1998 | Tsukagoshi et al. ......... | 257/783 |
| 6,060,332 A | * | 5/2000 | Martin ......................... | 438/25 |
| 6,150,902 A | * | 11/2000 | Unami ......................... | 333/189 |

FOREIGN PATENT DOCUMENTS

JP          11-168348          6/1999

* cited by examiner

Primary Examiner—Benny Lee
Assistant Examiner—Barbara Summons
(74) Attorney, Agent, or Firm—Dickstein, Shapiro, Morin & Oshinsky, LLP.

(57) ABSTRACT

An anisotropically electroconductive adhesive comprising a thermosetting insulating adhesive mixed with electroconductive particles, the thermosetting insulating adhesive having an intrinsic acoustic impedance of about 1.4 MPa·s/m or less is provided. Piezoelectric resonators are bonded to lands on an insulating substrate using this anisotropically electroconductive adhesive. The piezoelectric resonators are connected in a ladder type to form a ladder filter by pattern electrodes on the insulating substrate. When a filter is prepared using piezoelectric resonators, this anisotropically electroconductive adhesive can provide good filter characteristics without propagating the vibration of the piezoelectric resonators to the insulating substrate.

20 Claims, 4 Drawing Sheets

ANISOTROPICALLY ELECTROCONDUCTIVE ADHESIVE AND A LADDER FILTER USING THE SAME

BACKGROUND OF THE INVENTION

1. Field of the Invention

The present invention relates to an anisotropically electroconductive adhesive and a ladder filter using it. More specifically, it relates, for example, to an anisotropically electroconductive adhesive which is electroconductive in the direction of thermocompression bonding but is insulative in the other directions, and to a ladder filter using it.

2. Description of the Related Art

It is known that an electroconductive adhesive is used for conventionally bonding an external electrode formed on an piezoelectric resonator to a land formed on an insulating substrate in a ladder filter, that is, a piezoelectric part in which plural piezoelectric resonators utilizing mechanical resonance of a piezoelectric material are used (cf. Japanese Unexamined Patent Application Publication No. 11-168348).

The structure of this ladder filter will be explained. FIG. 1 is a top plan view showing an example of a ladder filter as disclosed in Japanese Unexamined Patent Application Publication No. 11-168348. FIG. 2 is its front view. A known insulating substrate such as a glass epoxy substrate or an alumina substrate is used as the insulating substrate b.

On one of the main surfaces of the insulating substrate b, four pattern electrodes c1, c2, c3 and c4 are formed with specific distances therebetween. On these pattern electrodes c1 through to c4, five lands e1, e2, e3, e4 and e5 are formed in line and with specific distances therebetween, wherein each of the lands e1 through to e4 is formed on one end of each of the pattern electrodes c1 through to c4, and the land e5 is formed on the other end of the pattern electrode c2.

On the lands e1 through to e5 of these pattern electrodes c1 through to c4, four piezoelectric resonators a1, b1, b2 and a2 are aligned in line and in this order, wherein the two piezoelectric resonators a1 and a2 are used as serial resonators having the same structure, and the other two piezoelectric resonators b1 and b2 are used as parallel resonators having the same structure as shown in FIG. 3.

Furthermore, in this ladder filter, the central portion in the lengthwise direction (in the up/down direction on the surface of FIG. 1) of an external electrode f1 of the piezoelectric resonator a1 which is to be the first serial resonator, is bonded to the land e1 of the pattern electrode c1 with an electroconductive adhesive d. Thereby, the external electrode f1 of the piezoelectric resonator a1 is connected to the pattern electrode c1.

Also, the central portion in the lengthwise direction of an external electrode f2 of the piezoelectric resonator a1, and the central portion in the lengthwise direction of an external electrode f1 of the piezoelectric resonator b1 which is to be the first parallel resonator, are bonded to the land e2 of the pattern electrode c2 with the electroconductive adhesive d. Thereby, the external electrode f2 of the piezoelectric resonator a1 and the external electrode f1 of the piezoelectric resonator b1 are connected to the pattern electrode c2.

Furthermore, the central portion in the lengthwise direction of an external electrode f2 of the piezoelectric resonator b1, and the central portion in the lengthwise direction of an external electrode f1 of the piezoelectric resonator b2 which is to be the second parallel resonator, are bonded to the land e3 of the pattern electrode c3 with the electroconductive adhesive d. Thereby, the external electrode f2 of the piezoelectric resonator b1 and the external electrode f1 of the piezoelectric resonator b2 are connected to the pattern electrode c3.

Also, the central portion in the lengthwise direction of an external electrode f2 of the piezoelectric resonator b2, and the central portion in the lengthwise direction of an external electrode f1 of the piezoelectric resonator a2 which is to be the second serial resonator, are bonded to the land e4 of the pattern electrode c4 with the electroconductive adhesive d. Thereby, the external electrode f2 of the piezoelectric resonator b2 and the external electrode f1 of the piezoelectric resonator a2 are connected to the pattern electrode c4.

Furthermore, the central portion in the lengthwise direction of an external electrode f2 of the piezoelectric resonator a2 is bonded to the land e5 of the pattern electrode c2 with the electroconductive adhesive d. Thereby, the external electrode f2 of the piezoelectric resonator a2 is connected to the pattern electrode c2.

However, as miniaturization of products has accompanied a shortened distance between the lands formed on an insulating substrate, there is danger, with the conventional electroconductive adhesive, that an electroconductive adhesive spills out or exudes out of the adhesion area on heating and pressing, easily entailing short circuitry between the lands. Thereupon, in the course of the investigation related to the present invention, bonding with an anisotropically electroconductive adhesive was investigated for preventing this short circuitry between the lands.

The anisotropically electroconductive adhesive for use herein is a thermosetting insulating adhesive with which electroconductive particles are blended. Accordingly, by interposing an anisotropically electroconductive adhesive between an electronic part such as a circuit board and another electronic part such as a circuit board for thermocompression bonding, the electroconductive particles are contacted with one another in the direction of thermocompression to electrically connect both electronic parts, while both electronic parts are connected mechanically with the thermosetting insulating adhesive. On the other hand, the electroconductive particles are not contacted with one another in the directions other than the direction of compression bonding, resulting in an insulated state.

When such a thermosetting, anisotropically electroconductive adhesive interposes and is thermocompressed between both electronic parts, the curing agent causes a curing reaction to cure the thermosetting resin and to bond both electronic parts. In many cases, an epoxy type thermosetting resin is used for the thermosetting insulating adhesive. To be more specific, an epoxy resin in combination with a curing agent for an epoxy resin selected from the group of various materials consisting of a polyamide resin, an amine resin, an imidazole resin, a melamine resin, an anhydride, etc., is used.

However when a conventional anisotropically electroconductive adhesive was used for bonding a piezoelectric resonator to a pattern electrode on an insulating substrate, a problem of degraded filter characteristics would occur in a ladder filter shown in FIG. 1. It was found in the course of the investigation related to the present invention, that it was caused by the vibration of the piezoelectric resonator propagated through the anisotropically electroconductive adhesive to the insulating substrate, which was then propagated to another piezoelectric resonator.

Thus, one of the main objects of this invention is to provide an anisotropically electroconductive adhesive which furnishes good filter characteristics without allowing the vibration of a piezoelectric resonator to be propagated to the insulating substrate, in the connection of the piezoelectric resonator with a pattern electrode on the insulating substrate.

Another object of the present invention is to provide a ladder filter having good filter characteristics, by using such an anisotropically electroconductive adhesive.

SUMMARY OF THE INVENTION

One aspect of the present invention is an anisotropically electroconductive adhesive comprising a thermosetting insulating adhesive mixed with electroconductive particles, the thermosetting insulating adhesive having an intrinsic acoustic impedance of about 1.4 MPa·s/m or less.

It is preferable that the thermosetting insulating adhesive in such an anisotropically electroconductive adhesive have a rubber elasticity.

A silicone rubber, a urethane rubber, an isobutylene rubber, or a mixture of two or more of them can be used as the thermosetting insulating adhesive.

Furthermore, resin particles covered with a metal are preferably used as the electroconductive particles.

An anisotropically electroconductive adhesive comprising such metal-covered resin particles preferably further comprises a filler made of inorganic particles having a particle size smaller than that of the resin particles.

Furthermore, another aspect of the present invention is a ladder filter comprising an insulating substrate on which pattern electrodes are formed, and plural piezoelectric resonators connected serially or in parallel to form a ladder type circuit on the insulating substrate, wherein the piezoelectric resonators and the pattern electrodes are electroconductively bonded with each other with the above-described anisotropically electroconductive adhesive.

Regarding the anisotropically electroconductive adhesive according to the present invention, as a result of investigations made on the relationships between the physical properties of a thermosetting insulating adhesive in an anisotropically electroconductive adhesive, and the propagation of the vibration of piezoelectric resonators or the filter characteristics of a ladder filter, it was found that the less the intrinsic acoustic impedance of the thermosetting insulating adhesive was matched with the intrinsic acoustic impedance of an element, the more enhanced the effect for preventing from the propagation of the vibration was and the better the filter characteristics. Thus the present invention has been accomplished.

It was found that for use in manufacturing a filter using piezoelectric resonators of this type, an anisotropically electroconductive adhesive comprising electroconductive particles and a thermosetting insulating adhesive, the thermosetting insulating adhesive having an intrinsic acoustic impedance of about 1.4 MPa·s/m or less, is preferable as the anisotropically electroconductive adhesive which can prevent from propagation of the vibration.

To be specific, a silicone rubber, a urethane rubber and an isobutylene rubber are examples of the resin used for the thermosetting insulating adhesive which has an intrinsic acoustic impedance $\rho c$ (wherein $\rho$ representing specific gravity and c representing the speed of sound) which is greatly mismatched with that of a piezoelectric resonator using lead titanate zirconate.

By using, as the electroconductive particles, resin particles covered with a metal, electroconductivity is realized at the time of thermocompression bonding when the resin particles contact with one another to deform their shape. Furthermore, even when the thermosetting insulating adhesive expands thermally, the electroconductivity is maintained until the deformation of the resin particles has disappeared and the original shapes have been returned to result in loss of the contact between the resin particles. Thus, accurate electroconductivity can be obtained in spite of temperature fluctuation.

Furthermore, a filler is preferably compounded into this anisotropically electroconductive adhesive for preventing from exudation of the adhesive and precipitation of the electroconductive particles. Insulating inorganic particles can be used as the filler. As the examples, silicon dioxide, calcium carbonate, aluminum oxide, etc. are enumerated. It is necessary that these insulating inorganic particles should have a particle size smaller than that of the electroconductive particles. It is preferable that they have an average particle size in the range of from about 0.01 to 3 μm.

The above-described objects, the other objects, the features and the advantages of the present invention will be made clearer by the detailed explanation of the following embodiments of the invention with reference to the drawings.

DESCRIPTION OF THE PREFERRED EMBODIMENTS

Figure 1:
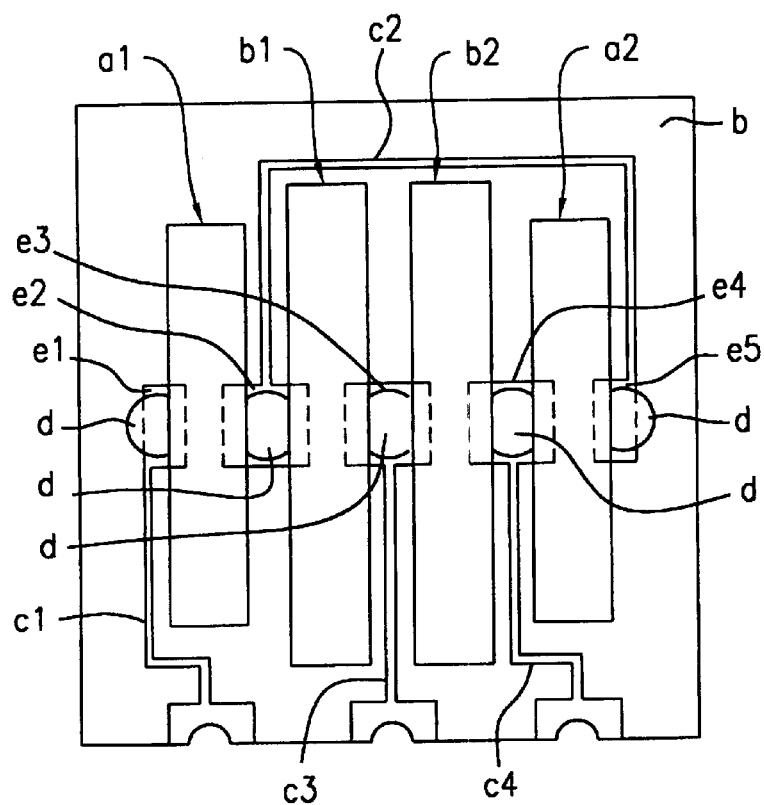
FIG. 1 is a top plan view showing an example of a ladder filter according to the present invention.
Figure 2:
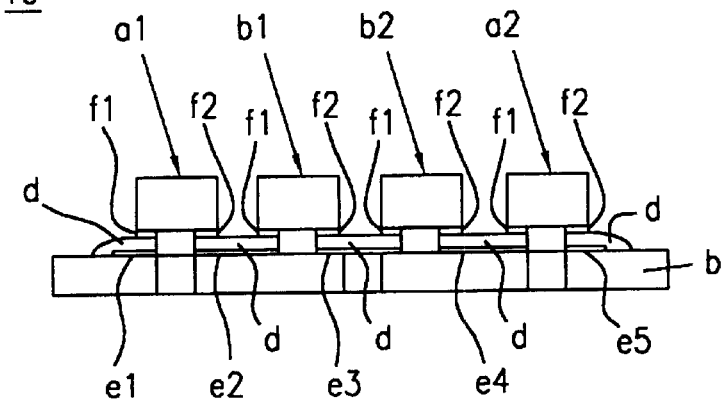
FIG. 2 is a front view of the ladder filter as shown in FIG. 1.

In a ladder filter 10 as shown in FIG. 1 and FIG. 2, the anisotropically electroconductive adhesive according to the present invention is used as the electroconductive adhesive d for use in bonding the external electrode f1 and f2 of the piezoelectric resonators a1, a2, b1 and b2 with the lands e1 through to e5. As the thermosetting insulating adhesive for use in the anisotropically electroconductive adhesive, one selected from the group consisting of a silicone rubber, a urethane rubber, an isobutylene rubber, etc., or a mixture of two or more of them is used, for example. Furthermore, metal-coated resin particles are used as the electroconductive particles. Furthermore, insulating inorganic particles such as silicon dioxide, calcium carbonate, or aluminum oxide are used as the filler. A filler with a particle size smaller than that of the electroconductive particles is used. A filler with an average particle size of from about 0.01 to 3 μm is preferable.

Using this anisotropically electroconductive adhesive, the piezoelectric resonators a1, a2, b1 and b2 are bonded to the lands e1 through to e5 formed on the insulating substrate b. At the time, the anisotropically electroconductive adhesive is cured by heating the piezoelectric resonators while performing compression bonding of them. It is noted that an anisotropically electroconductive adhesive is used which shows a rubber elasticity with an intrinsic acoustic impedance of about 1.4 MPa·s/m or less after curing.

When this anisotropically electroconductive adhesive is used, electroconductivity in the direction of compression bonding can be realized by deforming the electroconductive particles so that they contact with one another. However, the electroconductive particles do not contact with one another in the other directions, leaving the anisotropically electroconductive adhesive in an insulated state. Therefore, electroconductivity is realized between the external electrodes f1 and f2 of the piezoelectric resonators a1, a2, b1 and b2, and the lands e1 through to e5, but insulated state is maintained in the directions in parallel with the surface of the insulating substrate b.

Figure 3:
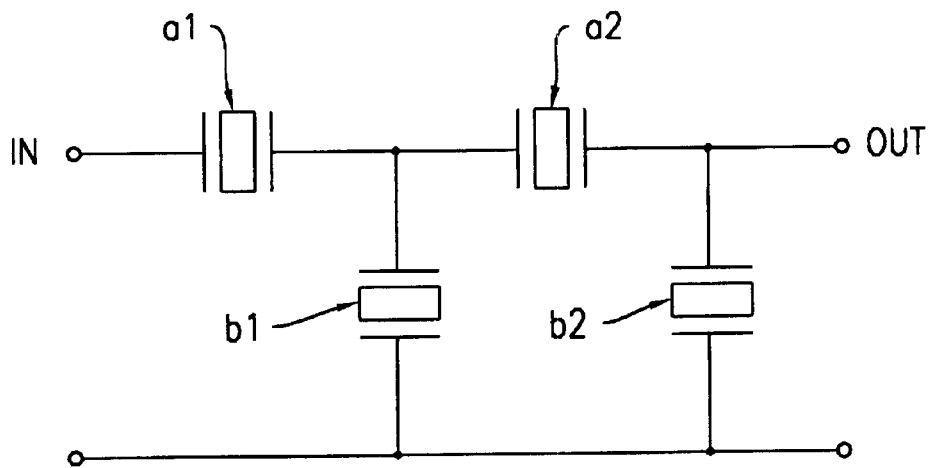
FIG. 3 is a circuit diagram of the ladder filter as shown in FIGS. 1 and 2.

The circuit as shown in FIG. 3 is obtained with this ladder filter 10, and since the anisotropically electroconductive adhesive has a rubber elasticity and an intrinsic acoustic impedance of about 1.4 MPa·s/m or less, the impedance is mismatched with the intrinsic acoustic impedance of the piezoelectric resonators a1, a2, b1 and b2 so that it becomes difficult for the vibration of the piezoelectric resonators to propagate to the insulating substrate b. Accordingly, good filter characteristics can be obtained with this filter 10.

Also, since the anisotropically electroconductive adhesive has an insulating property in parallel with the surface of the insulating substrate b, short circuits can be prevented, even when the distance between the lands is made smaller owing to the miniaturization of the insulating substrate b so that the lands are connected through the anisotropically electroconductive adhesive d which has spread out.

With this anisotropically electroconductive adhesive, since the metal-coated resin particles are used as the electroconductive particles, they are deformed to contact with one another when thermal compression bonding is performed, so that electroconductivity is realized. Accordingly, even when the anisotropically electroconductive adhesive expands thermally by temperature fluctuation, the electroconductivity can be maintained unless the deformation of the electroconductive particles has disappeared and the original shapes have been returned to result in the electroconductive particles detached from one another. Therefore, this adhesive is more adaptable to temperature fluctuation in comparison with the case in which metal particles which are not deformed by the thermocompression bonding are used as the electroconductive particles.

Also, precipitation of the electroconductive particles can be prevented since this anisotropically electroconductive adhesive comprises a filler having a particle size smaller than that of the electroconductive particles. Furthermore, when the anisotropically electroconductive adhesive is applied, it is made to be less mobile to flow so that its exudation to the area between the lands can be prevented.

EXAMPLES

Example 1

An anisotropically electroconductive adhesive was prepared by blending 100 parts by weight of an addition reaction type silicone rubber for a cured product having an intrinsic acoustic impedance of 0.9 MPa·s/m with 12 parts by weight of Au-covered resin particles having a particle size of 15 µm and 7 parts by weight of silicon dioxide having an average particle size of 0.01 µm. This anisotropically electroconductive adhesive was applied over to the lands on an insulating substrate. Piezoelectric resonators were mounted on them. The adhesive was thermally cured at 150° C. for one hour while applying a pressure necessary for deforming the electroconductive particles.

Example 2

An anisotropically electroconductive adhesive was prepared by blending 100 parts by weight of an addition reaction type silicone rubber for a cured product having an intrinsic acoustic impedance of 1.1 MPa·s/m with 10 parts by weight of Au-covered resin particles having a particle size of 15 µm and 5 parts by weight of silicon dioxide having an average particle size of 0.01 µm. This anisotropically electroconductive adhesive was applied over to the lands on an insulating substrate. Piezoelectric resonators were mounted on them. The adhesive was thermally cured at 150° C. for one hour while applying a pressure necessary for deforming the electroconductive particles.

Example 3

An anisotropically electroconductive adhesive was prepared by blending 100 parts by weight of an addition reaction type silicone rubber for a cured product having an intrinsic acoustic impedance of 1.1 MPa·s/m with 9 parts by weight of Au-covered resin particles having a particle size of 5 µm and 5 parts by weight of silicon dioxide having an average particle size of 0.01 µm. This anisotropically electroconductive adhesive was applied over to the lands on an insulating substrate. Piezoelectric resonators were mounted on them. The adhesive was thermally cured at 150° C. for one hour while applying a pressure necessary for deforming the electroconductive particles.

Example 4

An anisotropically electroconductive adhesive was prepared by blending 100 parts by weight of an isocyanate compound having trilene diisocyanate as the base, with 10 parts by weight of an alicyclic amine, 11 parts by weight of Au-covered resin particles having a particle size of 15 µm, and 5 parts by weight of silicon dioxide having an average particle size of 0.01 µm. This anisotropically electroconductive adhesive was applied over to the lands on an insulating substrate. Piezoelectric resonators were mounted on them. The adhesive was thermally cured at 160° C. for one hour while applying a pressure necessary for deforming the electroconductive particles.

Comparative Example 1

An anisotropically electroconductive adhesive was prepared by blending 100 parts by weight of a bisphenol-A type epoxy resin, with 20 parts by weight of an imidazole compound adducted with an epoxy resin, 12 parts by weight of Au-covered resin particles having a particle size of 15 µm, and 5 parts by weight of silicon dioxide having an average particle size of 0.01 µm. This anisotropically electroconductive adhesive was applied over to the lands on an insulating substrate. Piezoelectric resonators were mounted on them. The adhesive was thermally cured at 150° C. for one hour while applying a pressure necessary for deforming the electroconductive particles.

The intrinsic acoustic impedance could be calculated based on the specific gravity and the speed of sound. The measurement of the speed of sound was performed at a measuring frequency of 0.5 MHZ, using an ultrasonic viscoelasticity measuring apparatus. A silicone rubber and a urethane rubber, both having a thickness of 5 mm, and an epoxy resin having a thickness of 10 mm were used as test pieces for the measurement.

Figure 4:
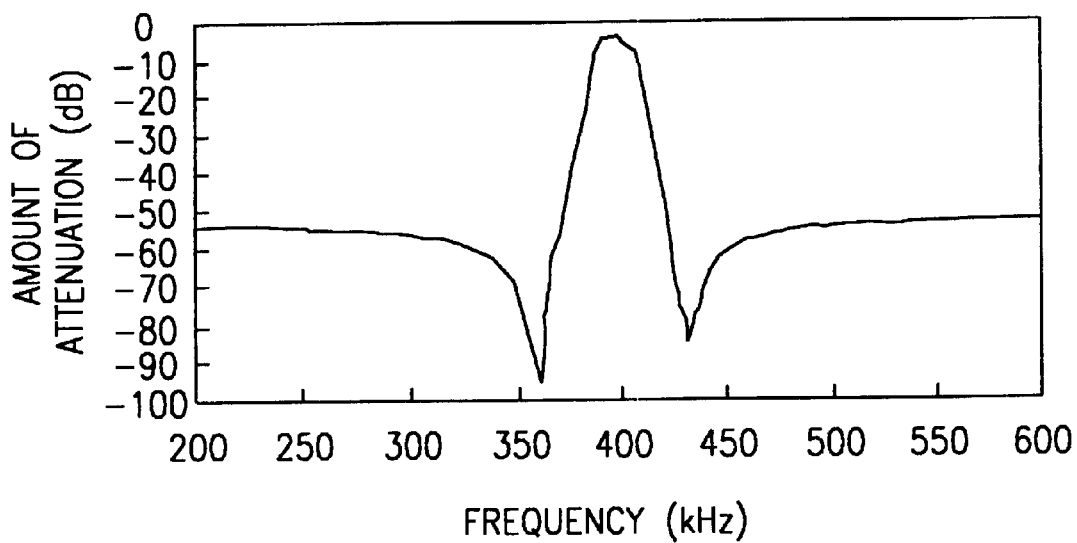
FIG. 4 is a graph showing the frequency characteristics of the ladder filter as shown in Example 1.
Figure 5:
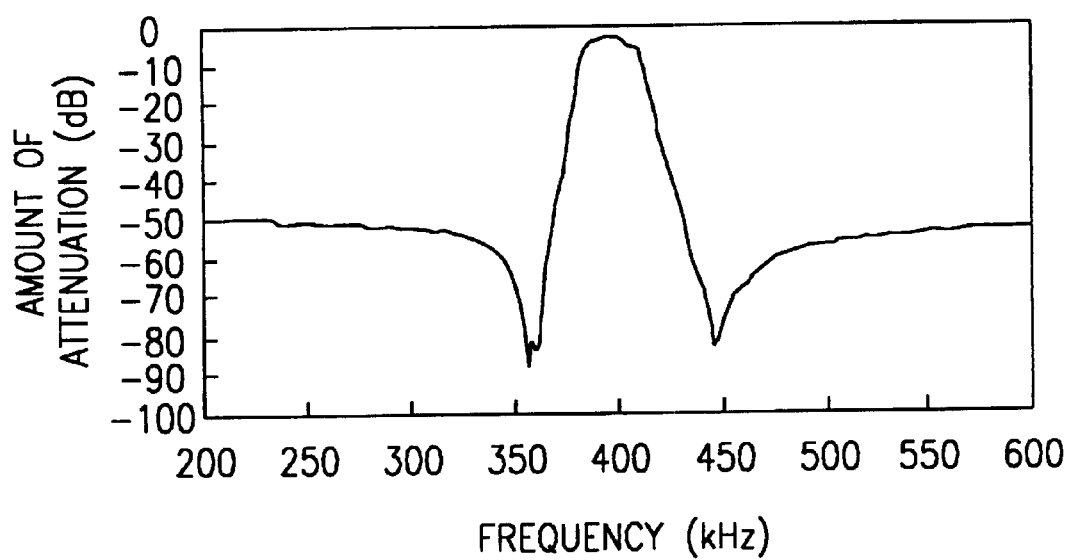
FIG. 5 is a graph showing the frequency characteristics of the ladder filter as shown in Example 2.
Figure 6:
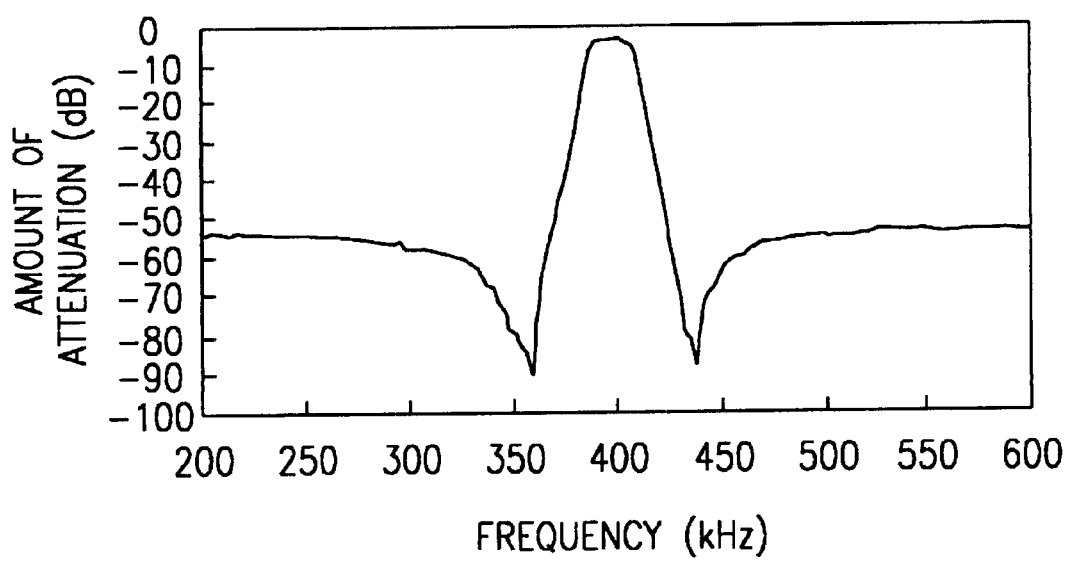
FIG. 6 is a graph showing the frequency characteristics of the ladder filter as shown in Example 3.
Figure 7:
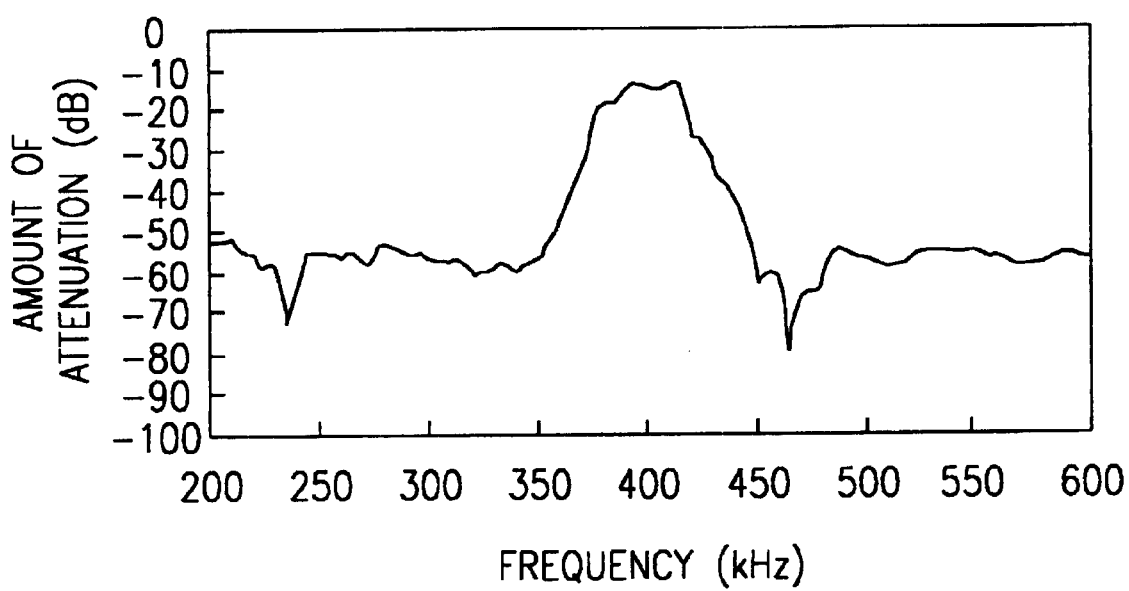
FIG. 7 is a graph showing the frequency characteristics of the ladder filter as shown in Comparative Example 1.

As regards each of them, the intrinsic acoustic impedances of the thermosetting insulating adhesives in the anisotropically electroconductive adhesives and the filter characteristics of the prepared ladder filters are shown in Table 1. Furthermore, the frequency characteristics of the filters of Examples 1 to 3 are shown in FIGS. 4 to 6. The frequency characteristics of the filter of Comparative Example 1 is shown in FIG. 7.

TABLE 1

| Item | Examples | | | | Comparative |
| --- | --- | --- | --- | --- | --- |
| | Example 1 | Example 2 | Example 3 | Example 4 | Comparative Example 1 |
| Intrinsic Acoustic Impedance of Insulating Adhesive (MPa × s/m) | 0.9 | 1.1 | 1.1 | 1.4 | 2.8 |
| Filter Characteristics | ○ | ○ | ○ | ○ | x |

As is understood from Table 1 and FIGS. 4 to 6, the anisotropically electroconductive adhesives of Examples 1 to 4 have intrinsic acoustic impedances of 1.4 MPa·s/m or less, resulting in good filter characteristics. In comparison with this, as is understood from Table 1 and FIG. 7, the anisotropically electroconductive adhesive of Comparative Example 1 has an intrinsic acoustic impedance of 2.8 MPa·s/m, failing in providing good filter characteristics.

When the anisotropically electroconductive adhesive according to the present invention is used in manufacturing a ladder filter, more of the vibration of a piezoelectric resonator is reflected on the interface of the piezoelectric resonator and the anisotropically electroconductive adhesive, resulting in less penetration of the vibration, owing to the fact that the intrinsic acoustic impedance of the thermosetting insulating adhesive is mismatched with that of the piezoelectric resonator. As a result, the vibration of the piezoelectric resonator is hard to propagate to the insulating substrate as well as to another piezoelectric resonator on the insulating substrate, providing good filter characteristics.

Furthermore, since it is anisotropically electroconductive, short circuitry between electrodes by exudation or the like of the anisotropically electroconductive adhesive can be prevented, when the distance between the electrodes on a substrate is shortened in accordance with the miniaturization of a product.

What is claimed is:

1. An anisotropically electroconductive adhesive comprising a thermosetting insulating adhesive mixed with electroconductive particles, said thermosetting insulating adhesive having an intrinsic acoustic impedance of about 1.4 MPa·s/m or less.

2. An anisotropically electroconductive adhesive according to claim 1, wherein said thermosetting insulating adhesive comprises a rubber.

3. An anisotropically electroconductive adhesive according to claim 2, wherein said rubber is at least one member selected from the group consisting of silicone rubber, urethane rubber and isobutylene rubber.

4. A ladder filter comprising
   an insulating substrate having pattern electrodes thereon, and
   plural piezoelectric resonators connected so as to form a ladder circuit on said insulating substrate,
   wherein said piezoelectric resonators and said pattern electrodes are electroconductively bonded with each other by the anisotropically electroconductive adhesive according to claim 3.

5. An anisotropically electroconductive adhesive according to claim 3, wherein said electroconductive particles comprise resin particles covered by metal.

6. A ladder filter comprising
   an insulating substrate having pattern electrodes thereon, and
   plural piezoelectric resonators connected so as to form a ladder circuit on said insulating substrate,
   wherein said piezoelectric resonators and said pattern electrodes are electroconductively bonded with each other by the anisotropically electroconductive adhesive according to claim 5.

7. An anisotropically electroconductive adhesive according to claim 5, further comprising an inorganic particulate filler having a particle size smaller than that of said resin particles.

8. A ladder filter comprising
   an insulating substrate having pattern electrodes thereon, and
   plural piezoelectric resonators connected so as to form a ladder circuit on said insulating substrate,
   wherein said piezoelectric resonators and said pattern electrodes are electroconductively bonded with each other by the anisotropically electroconductive adhesive according to claim 7.

9. An anisotropically electroconductive adhesive according to claim 7, in which the filler particles have an average particle size of about 0.01–3 μm.

10. A ladder filter comprising
    an insulating substrate having pattern electrodes thereon, and
    plural piezoelectric resonators connected so as to form a ladder circuit on said insulating substrate,
    wherein said piezoelectric resonators and said pattern electrodes are electroconductively bonded with each other by the anisotropically electroconductive adhesive according to claim 9.

11. An anisotropically electroconductive adhesive according to claim 2, wherein said electroconductive particles comprise resin particles covered by metal and further comprising an inorganic particulate filler having a particle size smaller than that of said resin particles.

12. A ladder filter comprising
    an insulating substrate having pattern electrodes thereon, and
    plural piezoelectric resonators connected so as to form a ladder circuit on said insulating substrate,
    wherein said piezoelectric resonators and said pattern electrodes are electroconductively bonded with each other by the anisotropically electroconductive adhesive according to claim 10.

13. An anisotropically electroconductive adhesive according to claim 11, in which the filler particles have an average particle size of about 0.01–3 μm.

14. A ladder filter comprising
    an insulating substrate having pattern electrodes thereon, and
    plural piezoelectric resonators connected so as to form a ladder circuit on said insulating substrate,
    wherein said piezoelectric resonators and said pattern electrodes are electroconductively bonded with each other by the anisotropically electroconductive adhesive according to claim 2.

15. An anisotropically electroconductive adhesive according to claim 1, wherein said electroconductive particles comprise resin particles covered by metal.

16. A ladder filter comprising an insulating substrate having pattern electrodes thereon, and plural piezoelectric resonators connected so as to form a ladder circuit on said insulating substrate, wherein said piezoelectric resonators and said pattern electrodes are electroconductively bonded with each other by the anisotropically electroconductive adhesive according to claim 15.

17. An anisotropically electroconductive adhesive according to claim 15, further comprising an inorganic particulate filler having a particle size smaller than that of said resin particles.

18. A ladder filter comprising an insulating substrate having pattern electrodes thereon, and plural piezoelectric resonators connected so as to form a ladder circuit on said insulating substrate, wherein said piezoelectric resonators and said pattern electrodes are electroconductively bonded with each other by the anisotropically electroconductive adhesive according to claim 17.

19. An anisotropically electroconductive adhesive according to claim 17, in which the filler particles have an average particle size of about 0.01–3 μm.

20. A ladder filter comprising an insulating substrate having pattern electrodes thereon, and plural piezoelectric resonators connected so as to form a ladder circuit on said insulating substrate, wherein said piezoelectric resonators and said pattern electrodes are electroconductively bonded with each other by the anisotropically electroconductive adhesive according to claim 1.

* * * * *